United States Patent
Lee

(10) Patent No.: US 7,060,630 B2
(45) Date of Patent: Jun. 13, 2006

(54) METHOD OF FORMING ISOLATION FILM OF SEMICONDUCTOR DEVICE

(75) Inventor: Sung Hoon Lee, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 267 days.

(21) Appl. No.: 10/628,803

(22) Filed: Jul. 28, 2003

(65) Prior Publication Data

US 2004/0127035 A1    Jul. 1, 2004

(30) Foreign Application Priority Data

Dec. 27, 2002   (KR)   ............... 10-2002-0085460

(51) Int. Cl.
*H01L 21/302* (2006.01)
(52) U.S. Cl. ............ 438/745; 438/408; 438/409; 438/750
(58) Field of Classification Search ............ 438/745, 438/750, 753, 756, 408, 409, 452
See application file for complete search history.

(56) References Cited

U.S. PATENT DOCUMENTS

| | | | | |
|---|---|---|---|---|
| 5,501,787 A | * | 3/1996 | Bassous et al. | 205/124 |
| 5,903,040 A | * | 5/1999 | Hong | 257/510 |
| 6,528,433 B1 | * | 3/2003 | Gartner et al. | 438/786 |
| 6,673,693 B1 | * | 1/2004 | Kirchhoff | 438/409 |

FOREIGN PATENT DOCUMENTS

| | | |
|---|---|---|
| JP | 11-87489 | 3/1999 |
| KR | 100189736 B1 | 1/1999 |

OTHER PUBLICATIONS

Office Action from Korean Intellectual Property Office dated Oct. 19, 2004.
Office Action from Chinese Patent Office dated Jul., 2005 and accompanying letter from Chinese Associate regarding the same.

* cited by examiner

Primary Examiner—Lan Vinh
(74) Attorney, Agent, or Firm—Marshall, Gerstein & Borun LLP

(57) ABSTRACT

Disclosed is a method of forming the isolation film in the semiconductor device. The method comprises the steps of sequentially forming a pad oxide film and a pad nitride film on a silicon substrate, forming a photoresist pattern through which an isolation region is opened, on the pad nitride film, etching the pad nitride film and the pad oxide film using the photoresist pattern as an etch mask, thus exposing the silicon substrate of the isolation region, implementing an electrochemical etch process to form porous silicon in the silicon substrate of the exposed isolation region, removing the photoresist pattern, and implementing a thermal oxidization process to oxidize porous silicon, thereby forming an oxide film in the isolation region.

8 Claims, 3 Drawing Sheets

METHOD OF FORMING ISOLATION FILM OF SEMICONDUCTOR DEVICE

BACKGROUND OF THE INVENTION

1. Field of the Invention

The present invention relates to a method of manufacturing a semiconductor device, and more particularly, to a method of forming an isolation film in a semiconductor device by which porous silicon is formed at a portion to be insulated using electrochemical etch and porous silicon is then oxidized, using a thermal oxidation process, to form an isolation film.

2. Background of the Related Art

The semiconductor memory device usually employs a shallow trench isolation (hereinafter called 'STI') process as an isolation process. As the cell size is reduced due to higher integration of the semiconductor memory device, the active region and the isolation region are defined using a shallow trench isolation film.

A process of forming the shallow trench isolation film will be now described. A pad oxide film and a pad nitride film are formed on a semiconductor substrate. A photoresist pattern defining an isolation region is then formed. Next, the pad nitride film, the pad oxide film and the semiconductor substrate are etched using the photoresist pattern as an etch mask, thereby forming a trench within the semiconductor substrate.

A high density plasma (HDP) oxide film is deposited to bury the trench. At this time, the HDP oxide film is deposited in a thickness sufficient to deposit the top surface of the pad nitride film while burying the trench. Thereafter, the HDP oxide film is polished by a chemical mechanical polishing (CMP) process. The CMP process is implemented until the pad nitride film is exposed. The pad nitride film is removed. Next, an ion implantation process is performed in order to form a well junction and control the threshold voltage. The pad oxide film is then removed.

However, the above method has disadvantages that the etch process for forming the trench using plasma is difficult due to shrinkage of the trench distance, over-hang occurs at the entrance portion of the trench when the HDP oxide film is gap-filled, seam or void occurs within the trench accordingly, and reliability of the semiconductor device may be degraded since void occurs within the HDP oxide film gap-filling the trench.

SUMMARY OF THE INVENTION

Accordingly, the present invention is contrived to substantially obviate one or more problems due to limitations and disadvantages of the related art, and an object of the present invention is to provide a method of forming isolation film in a semiconductor device by which porous silicon is formed at a portion to be insulated using electrochemical etch and porous silicon is then oxidized, using a thermal oxidation process, to form an isolation film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a isolation film in a semiconductor device according to the present invention is characterized in that it comprises the steps of sequentially forming a pad oxide film and a pad nitride film on a silicon substrate, forming a photoresist pattern through which an isolation region is opened, on the pad nitride film, etching the pad nitride film and the pad oxide film using the photoresist pattern as an etch mask, thus exposing the silicon substrate of the isolation region, implementing an electrochemical etch process to form porous silicon in the silicon substrate of the exposed isolation region, removing the photoresist pattern, and implementing a thermal oxidation process to oxidize porous silicon, thereby forming an oxide film in the isolation region.

The electrochemical etch process is implemented using a silicon dissociation reaction in a work cell that is designed to apply a voltage to the back of the silicon substrate to be used as a work electrode, in which a counterpart electrode and a reference electrode are designed so that they are immersed into an electrolyte with them kept at a given distance and an ultraviolet ray source for illuminating ultraviolet rays to the work electrode is installed on the top. A platinum electrode may be used as the counterpart electrode. A hydrogen standard electrode may be used as the reference electrode. The electrolyte may use a solution where HF and ethanol are mixed at a given ratio. The method may further comprise the step of adding an inert gas to the electrolyte in order to prevent a hydrogen gas occurring during the dissociation reaction of silicon from hindering the silicon dissociation reaction. The voltage is 1.5V ~8V.

The thermal oxidization process is implemented using a wet oxidization mode at a temperature of 700~900° C. under $O_2$ and $H_2$ atmosphere In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
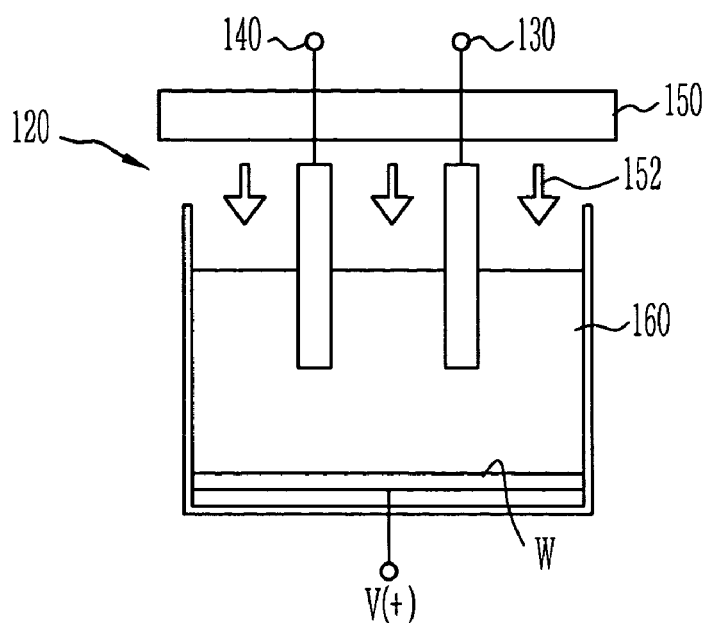
FIG. 1 illustrates a work cell for performing an electrochemical etch process according to a preferred embodiment of the present invention.

Reference will now be made in detail to the preferred embodiments of the present invention, examples of which are illustrated in the accompanying drawings, in which like reference numerals are used to identify the same or similar parts.

The present invention relates to a method of forming porosities through an electrochemical etch process to form an isolation film. The isolation film may be formed by forming porous silicon at a portion to be insulated using the electrochemical etch process and oxidizing porous silicon using a thermal oxidation process.

Figure 5:
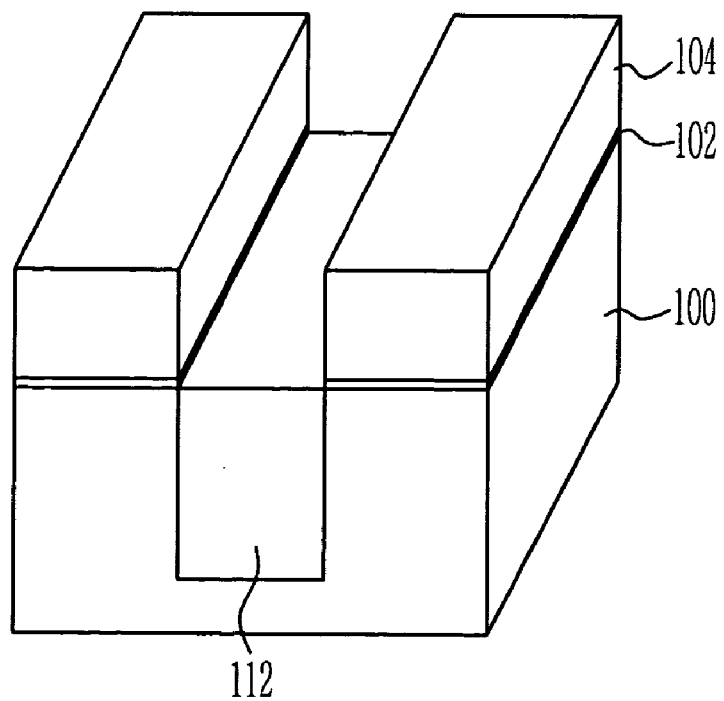
Figure 6:
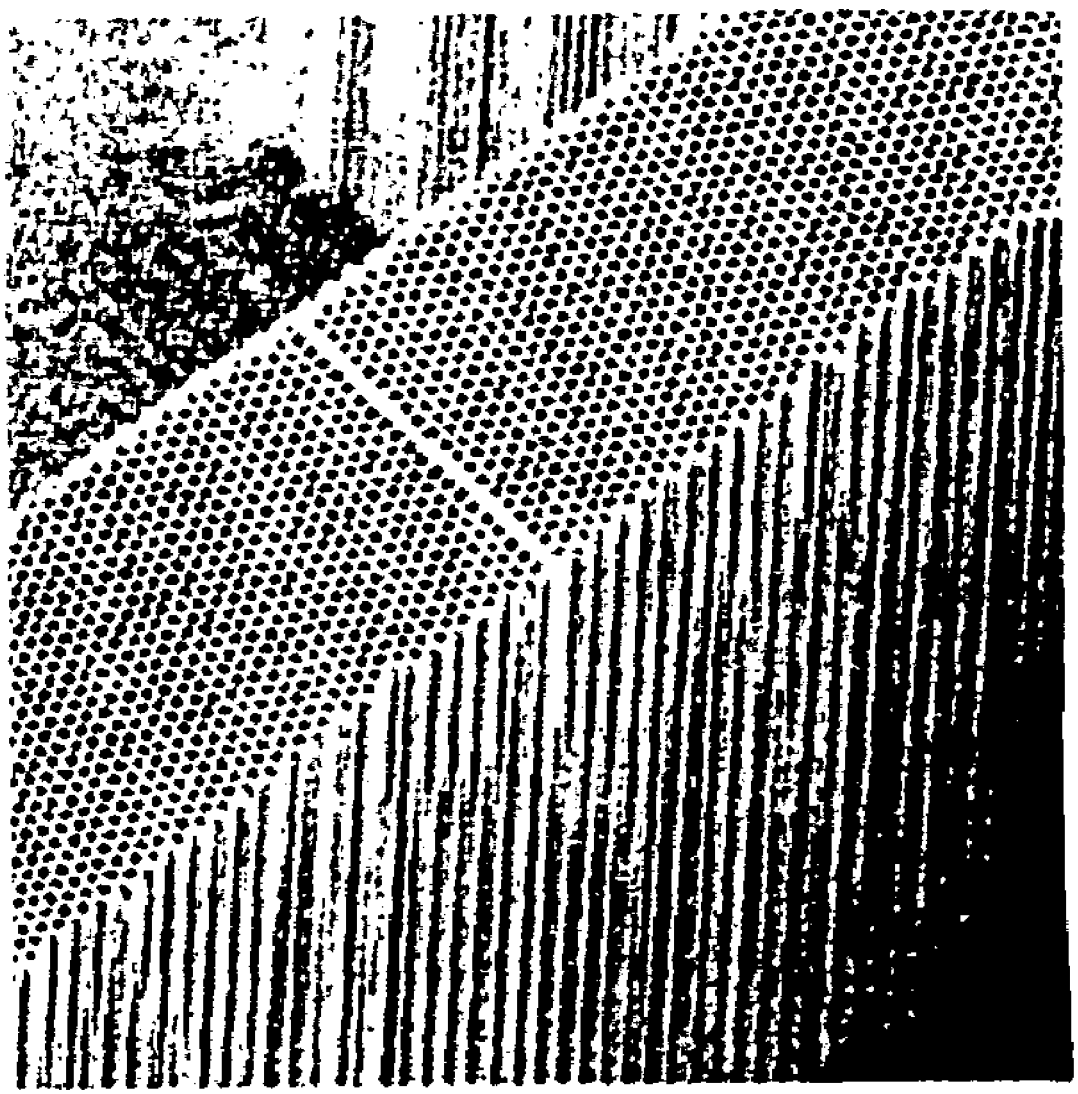
FIG. 6 is a SEM (scanning electron microscope) photograph showing porosities formed in the silicon substrate through electrochemical etch.

FIG. 1 illustrates a work cell for performing an electrochemical etch process according to a preferred embodiment of the present invention. FIG. 2~FIG. 5 illustrate semiconductor devices for explaining a method of forming porous silicon through electrochemical etch and then thermally oxidizing porous silicon to form an isolation film according to a preferred embodiment of the present invention. FIG. 6 is a SEM (scanning electron microscope) photograph showing porosities formed in the silicon substrate through electrochemical etch, which shows 'A' portion in FIG. 4.

Referring to FIG. 1, a work cell 120 for performing the electrochemical etch process in order to form porosities, is designed to apply a voltage (V) to the back of a wafer (W) to be used as a work electrode. A counterpart electrode 130 and a reference electrode 140 are designed so that they are immersed into the electrolyte 160 with them kept at a given distance. Also, an ultraviolet ray source 150 is located on the work cell 120 so that the ultraviolet rays 152 could be illuminated on the work electrode. The voltage (V) applied to the word electrode, i.e., the wafer (W) is about 1.5V~8V.

Figure 2:
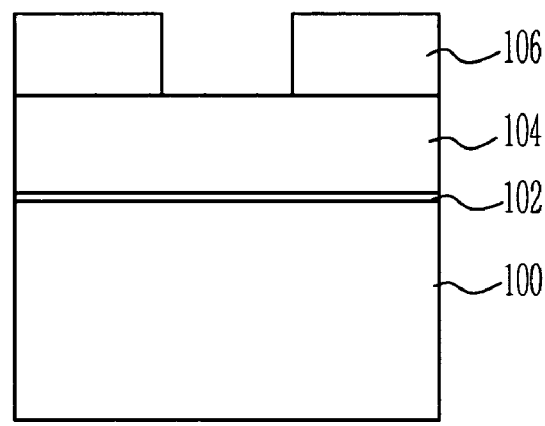
FIG. 2~FIG. 5 illustrate semiconductor devices for explaining a method of forming porous silicon through electrochemical etch and then thermally oxidizing porous silicon to form an isolation film according to a preferred embodiment of the present invention.

By reference to FIG. 2, a pad oxide film 102 and a pad nitride film 104 are sequentially formed on a silicon substrate 100. The pad oxide film 102 is formed in thickness of about 50~1000 Å and the pad nitride film 104 is formed in thickness of about 500~1500 Å. A photoresist pattern 106 defining an isolation region is formed on the pad nitride film 104.

Figure 3:
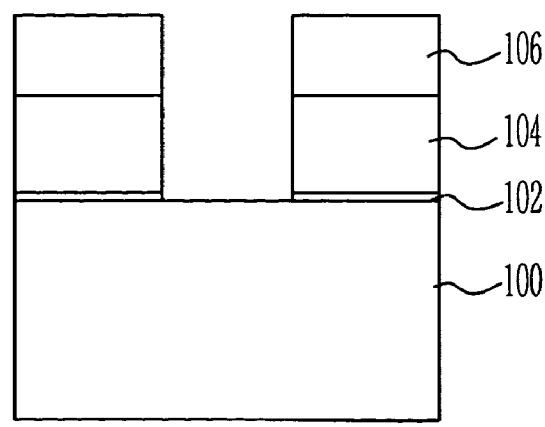

With reference to FIG. 3, the pad nitride film 104 and the pad oxide film 102 are etched using the photoresist pattern 106 as an etch mask, thereby exposing the silicon substrate 100 at a portion where an isolation region will be formed. The wafer (W) prepared as above is mounted on the work cell 120 and is then experienced by an electrochemical etch process.

Figure 4:
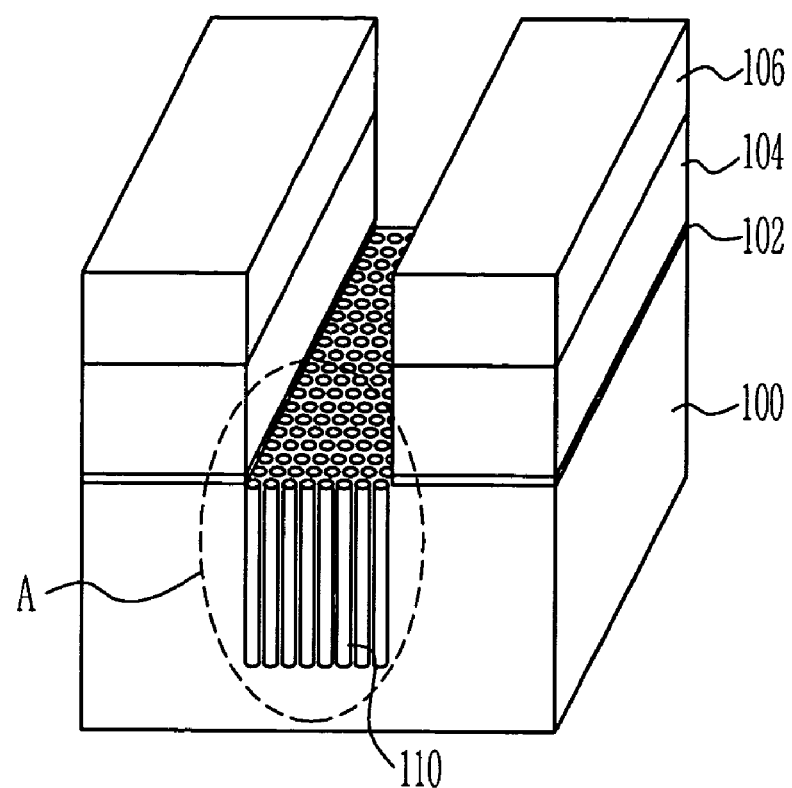

Turning to FIG. 1 and FIG. 4, the method of forming the isolation film according to the preferred embodiment of the present invention employs porosity formation by the electrochemical etch process. The process of forming the porosity is performed using a solution where 49% HF and ethanol are mixed as an electrolyte 160 while the ultraviolet rays 152 of a given wavelength are illuminated using the ultraviolet ray source 150. The work electrode used in the electrochemical etch process is the silicon wafer (W), a hydrogen standard electrode is used as the reference electrode 140 and a platinum electrode is used as the counterpart electrode 130. Reactive activation energy necessary for a dissociation reaction of silicon is supplied by applying the voltage (V) by which silicon could be dissociated to the work electrode. In order to prevent hindrance of the silicon dissociation reaction by generation of a hydrogen gas when the silicon dissociation reaction occurs, the hydrogen gas is removed from the reaction surface by adding an inert gas such as argon (Ar) to the electrolyte 160 and then bubbling it through the electrolyte.

A dissociation mechanism for electrochemical etch of silicon is as follows.

A silicon surface that reacts to the electrolyte 160 where HF and ethanol are mixed does not have a hole (h$^+$) since it is saturated with H atoms. The silicon surface is inert against attack of F-ion. This is because an atmosphere that F-ion can react is not prepared since there is no significant difference in the electronegativity between 2.2, the electronegativity of H and 1.9, the electronegativity of Si. If the hole (h$^+$) is supplied by the ultraviolet rays illuminated on the silicon surface, nucleophilic attack of the F-ion is made possible since the electronegativity of Si is relatively lowered compared to the H atoms.

In case of n type silicon, creating of the hole on the silicon surface is an important step to induce a dissociation procedure of silicon. If H is substituted with F, the electronegativity of Si is further lowered and attack of F_continuously occurs.

Hydrogen is generated by a series of reaction, partial dissociation occurs on the silicon surface by continuous attack of F- and a new surface is thus created. This change causes to vary distribution of an electric field on the silicon surface. As the hole is supplied from a bulk region of silicon to a portion where silicon is dissociated by this change of the electric field, the trench 112 is formed in a vertical direction parallel to a direction along which the hole is supplied as shown in FIG. 5. Porosities 110 are formed at the silicon substrate 100 being a region where the isolation region will be formed through this electrochemical etch as shown in FIG. 4.

When silicon exists under a positive bias (V) in a dilute HF solution, a current to voltage characteristic region where the porosities may be formed is a low voltage. Electrical polishing occurs at a high voltage. Both the reaction where the porosities are formed and an electrical polishing reaction occur at the intermediate region (transfer region) since silicon and HF reacts. Accordingly, the most important thing in the dissociation procedure of silicon when the voltage by which the porosities may be formed is applied to silicon, is the hole (h$^+$) being a carrier. This hole decides a dissociation speed of silicon. What the ultraviolet rays are illuminated when the silicon wafer is electrically chemically etched, is to sufficiently supply the holes to the space charge layer of the silicon surface so that the dissociation reaction can start in the step where silicon begins to dissociate.

The porosities could be formed through the following reaction equation 1.

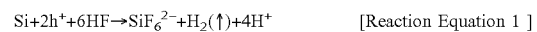   [Reaction Equation 1]

The electrical polishing reaction is generated through the following reaction equations 2 and 3.

   [Reaction Equation 2]

   [Reaction Equation 3]

In case where the porosities are formed by the electrical chemical etch method of the present invention, parameters that control the size of the porosity include the concentration of the electrolyte (volume ratio of HF and ethanol), the intensity of a voltage applied to the work electrode, reaction time, the intensity of the ultraviolet ray source, and the like. Furthermore, parameters that control the depth of the porosity include the intensity of the voltage applied and reaction time. The size and depth of the porosity could be controlled and the number of the porosity (degree of the porosity) for a given area could be controlled, using these parameters.

Referring to FIG. 5, the photoresist pattern 106 is removed. At this time, the photoresist pattern may be removed under an O$_2$ atmosphere by means of an ashing process. After porous silicon is formed through electrochemical etch, a thermal oxidization process is performed to form an oxide film. At this time, the thermal oxidization process may employ a wet oxidization mode. The thermal oxidization process is implemented at a temperature of about 700~9000° C. under $O_2$ and $H_2$ atmosphere. As such, if porous silicon is oxidized by the thermal oxidization process after porous silicon is formed through electrochemical etch, $O_2$ or $H_2O$ being an oxidizing agent is diffused into the $Si/SiO_2$ interface where Si reacts to $H_2O$ or $O_2$ to form $SiO_2$. Therefore, as silicon is consumed while the oxide film is grown, both the porosity and silicon could be formed to be the oxide film by controlling the size of the porosity and the degree of the porosity. If porous silicon is formed to be the oxide film by this method, it could be used as the isolation film of the semiconductor device.

As described above, the conventional process of forming the isolation film had problems that the trench etch process using plasma is difficult due to shrinkage of the trench distance, over-hang occurs at the entrance portion of the trench when the HDP oxide film is gap-filled, seam or void occurs within the trench accordingly, and reliability of the semiconductor device may be degraded since void occurs within the HDP oxide film that gap-fills the trench.

As described above, however, the present invention has a new effect that it can significantly simplify the process compared to a conventional isolation film formation process since the isolation film of the semiconductor device can be formed by a photolithography process, a process of etching the pad nitride film and the pad oxide film, an electrochemical etch process (porosity formation process) and the thermal oxidization process. Also, the present invention has advantageous effects that it can solve difficulty plasma etch depending on integration of the semiconductor device and a problem that void is formed within the HDP oxide film.

Furthermore, according to the present invention, the isolation film is formed on a silicon wafer surface. Therefore, the present invention has a new effect that it can prevent a phenomenon that a gate oxide film is made thin due to a moat generated in a conventional isolation film process.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming isolation film of semiconductor device, comprising:

sequentially forming a pad oxide film and a pad nitride film on a silicon substrate;

forming a photoresist pattern through which an isolation region is opened, on the pad nitride film;

etching the pad nitride film and the pad oxide film using the photoresist pattern as an etch mask, thus exposing the silicon substrate of the isolation region;

forming a plurality of vertically oriented pores that collectively have a shape of a trench in the exposed silicon substrate of the isolation region to form porous silicon by performing an electrochemical etch process using an electrolyte and an ultraviolet rays;

removing the photoresist pattern; and implementing a thermal oxidization process to oxidize porous silicon, thereby forming an oxide film in the isolation region.

2. The method as claimed in claim 1, wherein the electrochemical etch process is implemented using a silicon dissociation reaction in a work cell that is designed to apply a voltage to the back of the silicon substrate to be used as a work electrode, in which a counterpart electrode and a reference electrode are designed so that they are immersed into the electrolyte with them kept at a given distance and an ultraviolet ray source for illuminating the ultraviolet rays to the work electrode is installed on the top.

3. The method as claimed in claim 2, wherein a platinum electrode is used as the counterpart electrode.

4. The method as claimed in claim 2, wherein a hydrogen standard electrode is used as the reference electrode.

5. The method as claimed in claim 2, wherein the electrolyte employs a solution where HF and ethanol are mixed at a given ratio.

6. The method as claimed in claim 2, further comprising the step of adding an inert gas to the electrolyte in order to prevent a hydrogen gas occurring during the dissociation reaction of silicon from hindering the silicon dissociation reaction.

7. The method as claimed in claim 2, wherein the voltage is 1.5V~8V.

8. The method as claimed in claim 1, wherein the thermal oxidization process is implemented using a wet oxidization mode at a temperature of 700~900° C. under $O_2$ and $H_2$ atmosphere.

* * * * *